United States Patent [19]
Kalnitsky et al.

[11] Patent Number: 6,137,724
[45] Date of Patent: Oct. 24, 2000

[54] MEMORY DEVICE THAT UTILIZES SINGLE-POLY EPROM CELLS WITH CMOS COMPATIBLE PROGRAMMING VOLTAGES

[75] Inventors: Alexander Kalnitsky, San Francisco; Albert Bergemont, Palo Alto, both of Calif.

[73] Assignee: National Semiconductor Corporation, Santa Clara, Calif.

[21] Appl. No.: 09/427,344

[22] Filed: Oct. 26, 1999

Related U.S. Application Data

[60] Division of application No. 09/082,145, May 20, 1998, which is a continuation-in-part of application No. 09/053,309, Apr. 1, 1998.

[51] Int. Cl.[7] .................................................. G11C 16/04
[52] U.S. Cl. .............................. 365/185.18; 365/185.05; 365/185.28
[58] Field of Search ................... 365/185.05, 185.11, 365/185.18, 185.28

[56] References Cited

U.S. PATENT DOCUMENTS

| | | | |
|---|---|---|---|
| 3,774,087 | 11/1973 | Pepper | 317/235 R |
| 3,952,325 | 4/1976 | Beale et al. | 357/23 |
| 4,142,251 | 2/1979 | Mintz | 365/181 |
| 4,203,158 | 5/1980 | Frohman-Bentchkowsky et al. | 365/185 |
| 4,271,420 | 6/1981 | Chikamura et al. | 357/30 |
| 4,661,833 | 4/1987 | Mizutani | 365/185.18 |
| 4,742,491 | 5/1988 | Liang et al. | 365/218 |
| 4,822,750 | 4/1989 | Perlegos et al. | 437/52 |
| 4,931,847 | 6/1990 | Corda | 357/23.5 |
| 4,970,565 | 11/1990 | Wu et al. | 257/318 |
| 5,021,848 | 6/1991 | Chiu | 357/23.5 |
| 5,251,169 | 10/1993 | Josephson | 365/72 |
| 5,416,738 | 5/1995 | Shrivastava | 365/185 |
| 5,557,567 | 9/1996 | Bergemont et al. | 365/185.16 |
| 5,587,949 | 12/1996 | Bergemont et al. | 365/185.24 |
| 5,592,001 | 1/1997 | Asano | 257/316 |
| 5,594,685 | 1/1997 | Bergemont et al. | 365/185.03 |
| 5,612,914 | 3/1997 | Liu et al. | 365/185.26 |
| 5,633,518 | 5/1997 | Broze | 257/314 |
| 5,636,162 | 6/1997 | Coffman et al. | 365/185.22 |
| 5,687,118 | 11/1997 | Chang | 365/185.19 |
| 5,754,471 | 5/1998 | Peng et al. | 365/185.1 |
| 5,761,121 | 6/1998 | Chang | 365/185.14 |
| 5,761,126 | 6/1998 | Chi et al. | 365/185.27 |
| 5,812,452 | 9/1998 | Hoang | 365/185.11 |
| 5,818,761 | 10/1998 | Onakado et al. | 365/185.18 |
| 5,862,082 | 1/1999 | Dejenfelt et al. | 365/185.33 |
| 5,896,315 | 4/1999 | Wong | 365/185.01 |

OTHER PUBLICATIONS

Frohmann–Bentchkowsky, D., "THAM 7.3: A Fully–Decoded 2048–Bit Electrically–Programmable MOS–ROM," IEEE International Solid–State Circuits Conference, Feb. 18, 1971, Pennsylvania, PA., pp. 80–81; 200.

*Primary Examiner*—David Nelms
*Assistant Examiner*—Gene N. Auduong
*Attorney, Agent, or Firm*—Limbach & Limbach L.L.P.

[57] ABSTRACT

A memory device is disclosed which includes a plurality of memory cells formed in rows and columns. Each memory cell includes a Frohmann-Bentchkowsky p-channel memory transistor and an n-channel MOS access transistor. A plurality of page lines are utilized to contact each memory transistor, while a plurality of enable lines are utilized to contact each access transistor.

20 Claims, 10 Drawing Sheets

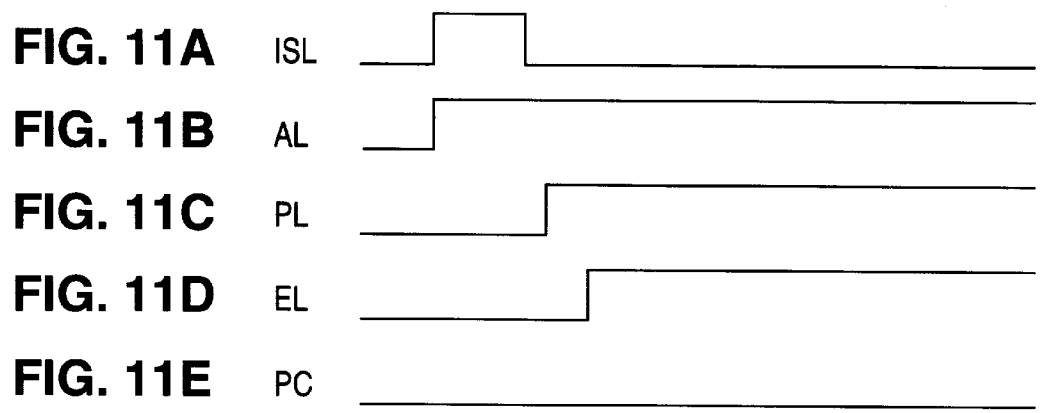
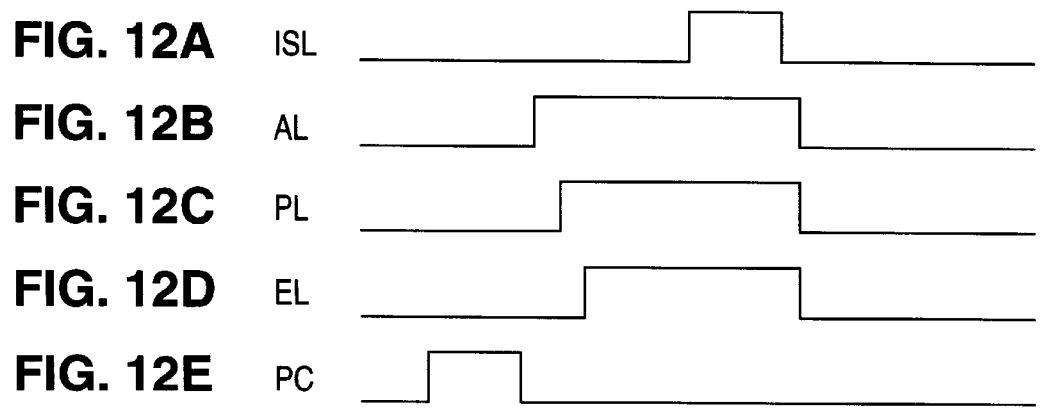

MEMORY DEVICE THAT UTILIZES SINGLE-POLY EPROM CELLS WITH CMOS COMPATIBLE PROGRAMMING VOLTAGES

RELATED APPLICATION

This is a divisional of application Ser. No. 09/082,145, filed May 20, 1998, which is a CIP of application Ser. No. 09/053,309, filed Apr. 1, 1998.

BACKGROUND OF THE INVENTION

1. Field of the Invention

The present invention relates to a memory device that utilizes single-poly electrically-programmable read-only-memory (EPROM) cells and, more particularly, to a memory device that utilizes single-poly EPROM cells which are programmed with CMOS compatible voltages.

2. Description of the Related Art

In the early 1970s, an electrically-programmable read-only-memory (EPROM) transistor based on a p-channel MOS device with a completely isolated gate was introduced by D. Frohmann-Bentchkowsky (see "A Fully Decoded 2048-bit Electrically Programmable MOSROM", IEEE ISSCC Digest of Technical Papers, p.80, 1971).

FIG. 1 shows a cross-sectional view that illustrates a Frohmann-Bentchkowsky memory transistor 10. As shown in FIG. 1, memory transistor 10 includes spaced-apart p-type source and drain regions 16 and 18, respectively, which are formed in an n-type well 14 which, in turn, is formed in a p-type substrate 12. (Source and drain regions 16 and 18 may alternately be formed in an n-type substrate).

In addition, transistor 10 also includes a channel region 20 which is defined between source and drain regions 16 and 18, and a layer of gate oxide 22 which is formed over channel region 20. Transistor 10 further includes a gate 24 which is formed over gate oxide layer 22, and a layer of insulation material 26 which, along with gate oxide layer 22, completely encapsulates gate 24. Since gate 24 is completely isolated, it is commonly referred to as a floating gate.

In operation, transistor 10 is programmed by applying biasing voltages to well 14 and drain 18 which are sufficient to induce avalanche breakdown. For example, avalanche breakdown is induced by applying ground to well 14 and a negative breakdown voltage to drain region 18 (while either grounding or floating source region 16), or by applying a positive breakdown voltage to well 14 and ground to drain region 18 (while floating or applying the positive breakdown voltage to source region 16).

The biasing voltages which are sufficient to induce avalanche breakdown establish a strong electric field across the drain-to-well junction depletion region. The strong junction electric field accelerates electrons in the junction depletion region (which are formed from thermally-generated electron-hole pairs) into hot electrons which then have ionizing collisions with the lattice, thereby forming "substrate hot electrons".

A number of these substrate hot electrons penetrate gate oxide layer 22 and begin accumulating on floating gate 24 due to the relatively positive potential on floating gate 24 with respect to drain region 18.

The potential on floating gate 24 is defined by the voltages which are coupled to floating gate 24 from well 14, source region 16, and drain region 18, and the surface area of floating gate 24 that is formed over these regions. Thus, since floating gate 24 is only marginally formed over source and drain regions 16 and 18, the potential on floating gate 24 is primarily determined by the voltage applied to well 14.

Therefore, when ground is applied to well 14 (and source region 16), and the negative breakdown voltage is applied to drain region 18 during programming, the potential on floating gate 24 is slightly less than ground which, in turn, is relatively positive with respect to the negative breakdown voltage applied to drain region 18.

(If a positive breakdown voltage is applied to well 14 and ground is applied to drain region 18, then floating gate 24 will have a potential slightly less than the positive breakdown voltage which, in turn, is positive with respect to ground which is applied to drain region 18).

Transistor 10 is read by applying ground to well 14 and source region 16, and a read voltage to drain region 18. If transistor 10 has been programmed, the negative charge on floating gate 24 causes channel region 20 to invert (which inversion is permanent as long as the negative charge remains on floating gate 24). As a result, the read biasing voltages applied to source and drain regions 16 and 18 cause a current to flow from drain region 18 to source region 16.

On the other hand, if transistor 10 has not been programmed, the slight negative charge which is coupled to floating gate 24 is insufficient to invert channel region 20. As a result, channel region 20 remains in accumulation. Thus, when the read biasing voltages are applied to source and drain regions 16 and 18, no current is able to flow.

Memory transistor 10 is erased by irradiating transistor 10 with ultraviolet (UV) light to remove the electrons. The UV light increases the energy of the electrons which, in turn, allows the electrons to penetrate the surrounding layers of oxide.

Thus, the Frohmann-Bentchkowsky transistor utilizes a p-channel MOS-type device to inject electrons onto the floating gate (as contrasted with more recent EPROM devices that use an n-channel MOS-type device to inject electrons onto the floating gate).

Although some of the first EPROMs sold by Intel™ were based on the Frohmann-Bentchkowsky transistor, the transistor was soon replaced with alternate structures, and has since fallen into relative obscurity.

The parent invention disclosed that by forming a Frohmann-Bentchkowsky memory transistor to have a physical gate length which is less than the physical gate length of a CMOS transistor, as defined by a predetermined design rule, the Frohmann-Bentchkowsky memory transistor is programmable with the voltages that are allowed under the predetermined design rule.

The parent invention, however, did not disclose the use of multiple Frohmann-Bentchkowsky memory transistors. Since numerous instances exist where more than a single EPROM device is required, there is a need for a memory device that incorporates a large number of Frohmann-Bentchkowsky memory transistors.

SUMMARY OF THE INVENTION

A memory device in accordance with the present invention utilizes a large number of Frohmann-Bentchkowsky memory transistors. The memory device, which is formed in a semiconductor material of a first conductivity type, includes a plurality of wells of a second conductivity type which are formed in the semiconductor material, and a plurality of memory cells that are arranged in rows and columns.

Each memory cell includes a Frohmann-Bentchkowsky memory transistor that has a source and a drain of the first conductivity type. The source and drain, in turn, are formed in a well which is electrically connected to the source of the memory transistor.

In addition, each memory cell also includes an access transistor that has a source and a drain of the second conductivity type which are formed in the substrate material, and a gate. Further, in each memory cell, the drain of the access transistor is connected to the drain of the memory transistor.

The memory device also includes a plurality of page lines which are formed adjacent to the rows of cells so that each page line is connected to the source of each memory transistor in a row of cells. A plurality of enable lines are also formed adjacent to the columns of cells so that each enable line is connected to the gate of each access transistor in a column of cells.

The memory device additionally includes a plurality of sense lines which are formed adjacent to the columns of cells so that each sense line is connected to the drain of each memory transistor in a column of cells. In an alternate embodiment, the sense lines are formed so that each sense line is connected to the source of each access transistor in a column of cells.

The memory device is programmed by selecting a row of memory cells to be programmed. In addition, an enable voltage is applied to each enable line that is connected to a to-be-programmed memory cell in the row of cells, while a programming voltage is applied to the page line that is connected to the row of cells selected to be programmed. As a result of these bias voltages, hot punchthrough holes are induced to flow from the source region to the drain region of each to-be-programmed transistor without inducing avalanche breakdown at the drain-to-semiconductor material junction. The hot punchthrough holes, in turn, cause electrons to be injected onto the gates of the to-be-programmed memory transistors.

The memory device is read by selecting a row of memory cells to be read. In addition, an enable voltage is applied to each enable line, while a read voltage is applied to the page line that is connected to the row of memory cells selected to be read. As a result of these bias voltages, a current is induced to flow in each memory cell that has been programmed.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 11A–11E are timing diagrams illustrating the operation of device 1000.

FIGS. 12A–12E are timing diagrams illustrating the operation of device 1000.

DETAILED DESCRIPTION

Figure 1:
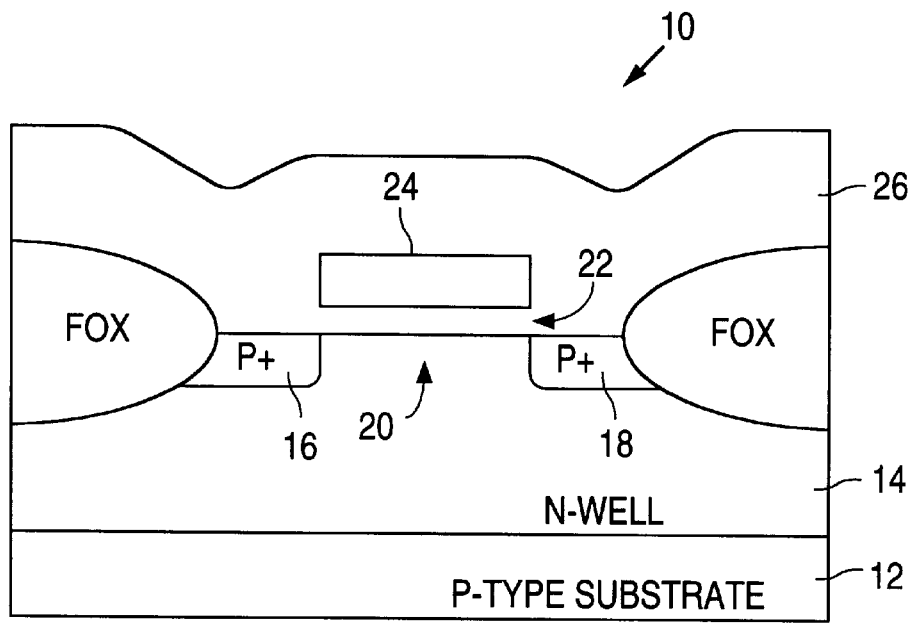
FIG. 1 is a cross-sectional view illustrating a Frohmann-Bentchkowsky EPROM memory transistor 10.

In accordance with the parent invention, the Frohmann-Bentchkowsky EPROM transistor of FIG. 1 is programmed by applying biasing voltages to well 14, source region 16, and drain region 18 which are sufficient to induce holes to flow from source region 16 to drain region 18 with enough kinetic energy to have ionizing collisions with the lattice, and insufficient to induce avalanche breakdown at the drain-to-well junction.

Holes will flow from source region 16 to drain region 18 when the depletion region associated with the reverse-biased drain-to-well junction extends over and overlaps with the depletion region associated with the source-to-well junction.

When the drain and source depletion regions overlap, which is known as punchthrough, the drain-to-source electric field reduces the potential energy barrier at the source-to-well junction. The reduced potential energy barrier, in turn, allows the holes in source region 16 to overcome the barrier, thereby producing a hole flow below the surface of the device from source region 16 to drain region 18.

When the holes flowing to drain region 18 are hot, the holes have ionizing collisions with the lattice that form substrate hot electrons. Some of the substrate hot electrons, in turn, penetrate the layer of gate oxide 22 and accumulate on floating gate 24. Since most of the substrate hot electrons are formed directly under floating gate 24 rather than at the drain-to-well junction, the programming of the parent invention is more efficient that the avalanche-breakdown programming of the prior art.

Whether the depletion region associated with the reverse-biased drain-to-well junction extends over and overlaps with the source-to-well depletion region, and whether the holes become "hot" as they flow to drain region 18, i.e., whether the holes have enough kinetic energy to have ionizing collisions with the lattice, is a function of the well doping concentration, the effective channel length, and the voltages applied to well 14, source region 16, and drain region 18.

Conventionally, semiconductor wells typically have an n-type dopant concentration in the range of $1\times10^{16}$ to $1\times10^{18}$ atoms/cm$^3$ for devices based on a 0.35 micron design rule, and $1\times10^{16}$ to $1\times10^{19}$ atoms/cm$^3$ for devices based on a 0.25 micron design rule, where the highest concentrations are usually found close to the silicon-oxide interface.

(As noted above, source and drain regions 16 and 18 may alternately be formed in a substrate rather than a well. Semiconductor substrates typically have an n-type dopant concentration in the range of $1\times10^{16}$ to $1\times10^{18}$ atoms/cm$^3$ for devices based on a 0.35 micron design rule, and $1\times10^{16}$ to $1\times10^{19}$ atoms/cm$^3$ for devices based on a 0.25 micron design rule, where the highest concentrations are usually found close to the silicon-oxide interface.)

Increasing the dopant concentration above these conventional levels reduces the strength of the drain-to-source electric field, and the breakdown voltage of the drain-to-substrate junction. Thus, transistor 10 preferably utilizes conventional substrate and well doping concentrations.

Conventional source and drain regions, in turn, typically have a p-type dopant concentration in the range of $1\times10^{19}$ to $1\times10^{21}$ atoms/cm$^3$ for devices based on a 0.35 micron design rule, and $1\times10^{19}$ to $1\times10^{21}$ atoms/cm$^3$ for devices based on a 0.25 micron design rule. As a result, for a conventionally-doped p-type drain region formed in a conventionally doped n-type substrate, the typical drain-to-well breakdown voltage is approximately 6–12 volts, depending on the specifics of the technology that is used.

With respect to the effective channel length, the channel length is defined by the physical gate length, while the effective channel length is defined by the amount of lateral diffusion that occurs after the source and drain regions have been formed.

For a given fabrication process, the amount of lateral diffusion, which is relatively minor, is approximately constant. Thus, although the effective channel length is less than the physical gate length, the effective channel length is defined by the physical gate length.

In the parent invention, memory transistor 10 is formed to have a physical gate length which allows hot punchthrough holes to flow from source region 16 to drain region 18 when the drain-to-source voltage is less than the drain-to-well breakdown voltage.

As a general rule, shorter channel devices, e.g., 0.25 and 0.35 micron devices, use higher substrate doping densities and shallower junctions than longer channel devices, thereby making the source and drain junctions more abrupt. These abrupt junctions reduce the junction breakdown voltages, while a higher channel doping increases the voltage required to induce punchthrough. The decrease in gate length does not affect the junction breakdown, but greatly reduces the voltage required to induce punchthrough.

Thus, with respect to the biasing voltages, ground is applied to drain 18, while a positive programming voltage is applied to well 14 and source 16 which is sufficient to induce holes to flow from source region 16 to drain region 18 with enough kinetic energy to have ionizing collisions with the lattice, and insufficient to induce avalanche breakdown at the drain-to-well junction.

For example, with a physical gate length of 0.35 microns based on a 0.35 micron design rule or technology (and conventional doping concentrations for the well, source, and drain), holes flowing from source region 16 to drain region 18 become hot when the voltage applied to well 14 and source region 16 is equal to approximately 5.75 volts.

Similarly, with a physical gate length of 0.25 microns based on a 0.25 micron design rule or technology (and conventional doping concentrations for the well, source, and drain), holes flowing from source region 16 to drain region 18 become hot when the voltage applied to well 14 and source region 16 is equal to approximately 4.5 volts.

In addition to the above, ground may alternately be applied to well 14 and source 16 while a negative programming voltage is applied to drain 18 which is sufficient to induce holes to flow from source region 16 to drain region 18 with enough kinetic energy to have ionizing collisions with the lattice, and insufficient to induce avalanche breakdown at the drain-to-well junction.

Further, the voltages applied to well 14 and source region 16 need not be the same. The voltage applied to source region 16 may be less than the voltage applied to well 14, thereby reverse biasing the source-to-well junction, or greater than the voltage applied to well 14, thereby forward biasing the source-to-well junction. A forward bias of not more than approximately 0.7 volts should increase hole injection into the depletion region, and may increase programming efficiency.

Thus, the parent invention utilizes hot punchthrough holes, which are generated at voltages which are significantly less than the voltages required to breakdown the drain-to-well junction, to inject electrons onto the floating gate.

In further accordance with the parent invention, memory transistor 10 is integratable into a conventional CMOS logic circuit by using a physical gate length which is less than the physical gate length of the MOS transistors in the CMOS circuit (with current generation CMOS processes, the NMOS and PMOS physical gate lengths are typically the same).

Figure 2:
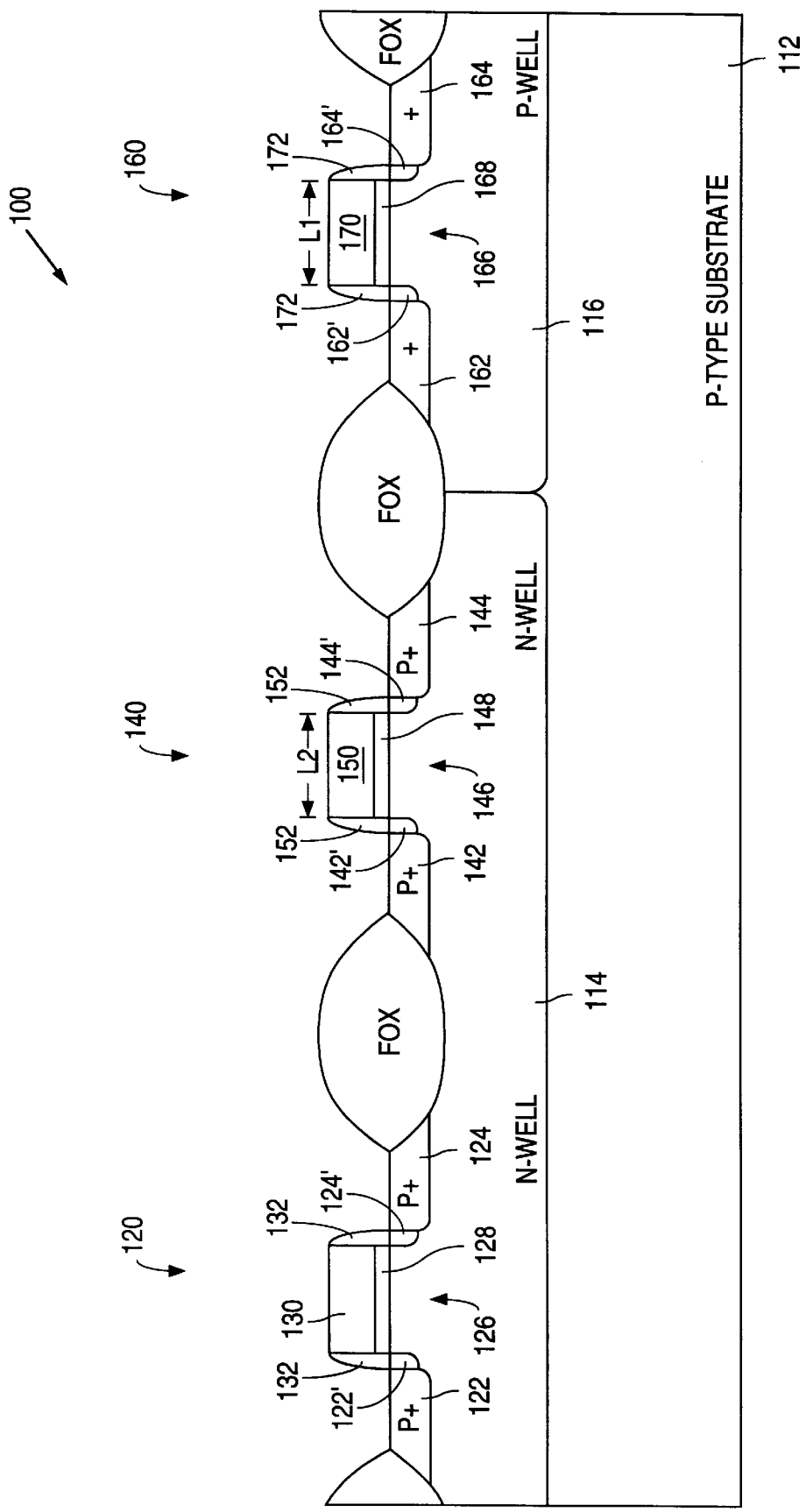
FIG. 2 is a cross-sectional view illustrating a CMOS logic circuit 100 in accordance with the parent invention.

FIG. 2 shows a cross-sectional view that illustrates a CMOS logic circuit 100 in accordance with the parent invention. As shown in FIG. 2, circuit 100 includes a PMOS transistor 120 and a Frohmann-Bentchkowsky EPROM transistor 140 which are formed in an n-well 114, and an NMOS transistor 160 which is formed in a p-type well 116. In addition, n-well 114 and p-well 116 are formed in a p-type substrate 112.

(Although circuit 100 is described as being formed in a twin-well that includes n-well 114 and p-well 116, circuit 100 may alternately be formed in a single well where transistors 120 and 140, or transistor 160, is formed directly in the substrate).

As further shown in FIG. 2, transistors 120 and 140 each have spaced-apart p-type source and drain regions 122/124 and 142/144, respectively, which are formed in n-well 114, while transistor 160 has spaced-apart n-type source and drain regions 162 and 164 which are formed in p-well 116.

(P-type source and drain regions 122/124 and 142/144 are shown in FIG. 2 as including PLDD regions 122'/124' and 142'/144', while N-type source and drain regions 162 and 164 are shown as including NLDD regions 162' and 164'. Alternately, halo-type LDD structures may also be used.)

In addition, transistors 120, 140, and 160 each have a channel region 126, 146, and 166, respectively, which is defined between source and drain regions 122/124, 142/144, and 162/164, respectively.

Further, transistors 120, 140, and 160 each have a layer of gate oxide 128, 148, and 168, respectively, which is formed over channel region 126, 146, and 166, respectively, and a gate 130, 150, and 170, respectively, which is formed over gate oxide layer 128, 148, and 168, respectively. In addition, oxide spacers 132, 152, and 172 are formed along the sidewalls of gates 130, 150, and 170, respectively.

In accordance with the parent invention, NMOS transistor 160 is formed to have a physical gate length L1, which is equal to the minimum physical gate length, while transistor 140 is formed to have a physical gate length L2 which is smaller than length L1.

Conventionally, the design rule or process technology that is used to form MOS transistors defines a minimum physical gate length. The minimum physical gate length is not the smallest feature size that is photolithographically obtainable, but is the smallest feature size that is allowed under the rule for CMOS devices.

Thus, for example, a 0.35 micron design rule or process technology defines a minimum physical gate length of 0.35 microns for the NMOS transistors. Similarly, a 0.25 micron design rule or process defines a minimum physical gate length of 0.25 microns for the NMOS transistors. As a result, the minimum physical gate length is commonly used to identify the design rule or process technology that is used to form MOS transistors.

Figure 3:
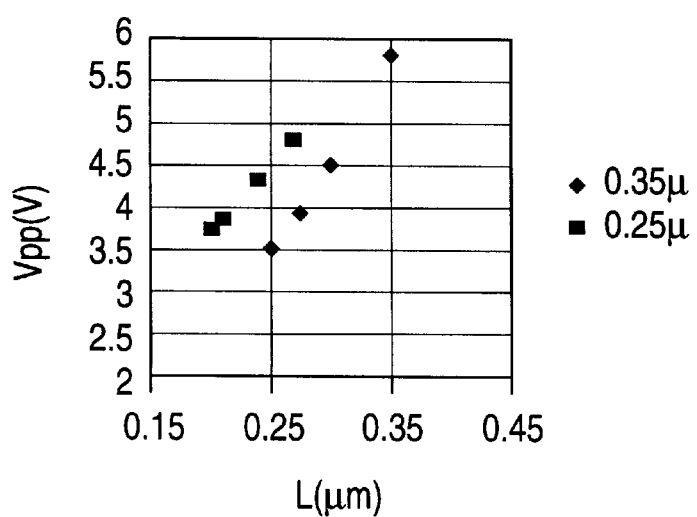
FIG. 3 is a graph illustrating a series of programming voltages versus physical floating gate lengths in accordance with the parent invention.

FIG. 3 shows a graph that illustrates a series of programming voltages versus physical floating gate lengths in accordance with the parent invention. As shown in FIG. 3, with a physical floating gate length of 0.25 microns based on a 0.35 micron design rule or technology (and conventional doping concentrations for the well, source, and drain), holes flowing from source region 142 to drain region 144 become hot when drain 144 is grounded and the voltage applied to n-well 114 and source region 142 is equal to approximately 3.5 volts.

CMOS devices fabricated with a 0.35 micron design rule conventionally use a power supply which has an average voltage of 3.3 volts and a maximum voltage of approximately 3.6 volts. Thus, by shortening the physical gate length of memory transistor 140 (which also shortens the channel length) with respect to the design rule or technology, transistor 140 can be programmed with the existing CMOS power supply.

Further, the maximum voltage rating, which is the maximum voltage that can be applied for a short period of time without destroying the device, is approximately 4.6 volts with a 0.35 micron design rule. Thus, if 4.5 volts can be obtained from an external or other power supply, memory transistor 140 can be formed with a physical gate length which is only slightly less than the design rule, e.g., approximately 0.30 microns.

Similarly, as extrapolated from FIG. 3, with a physical gate length of 0.15 microns based on a 0.25 micron design rule or technology (and conventional doping concentrations for the well, source, and drain), holes flowing from source region 142 to drain region 144 become hot when the voltage applied to well 114 and source region 142 is equal to approximately 2.7 volts.

CMOS devices fabricated with a 0.25 micron design rule conventionally use a power supply which has an average voltage of 2.5 volts, a maximum voltage of approximately 2.75 volts, and a maximum voltage rating in excess of 3.25 volts. Thus, by shortening the physical gate length with respect to the design rule, memory transistor 140 can be programmed by voltages that do not exceed the maximum voltage rating for the design rule.

Further, the Frohmann-Bentchkowsky EPROM cell of the parent invention is integratable into a standard CMOS fabrication process without any additional process steps. The cell of the parent invention primarily differs from a conventional CMOS transistor in that the physical gate length is shorter (and the gate is electrically isolated).

Figure 4:
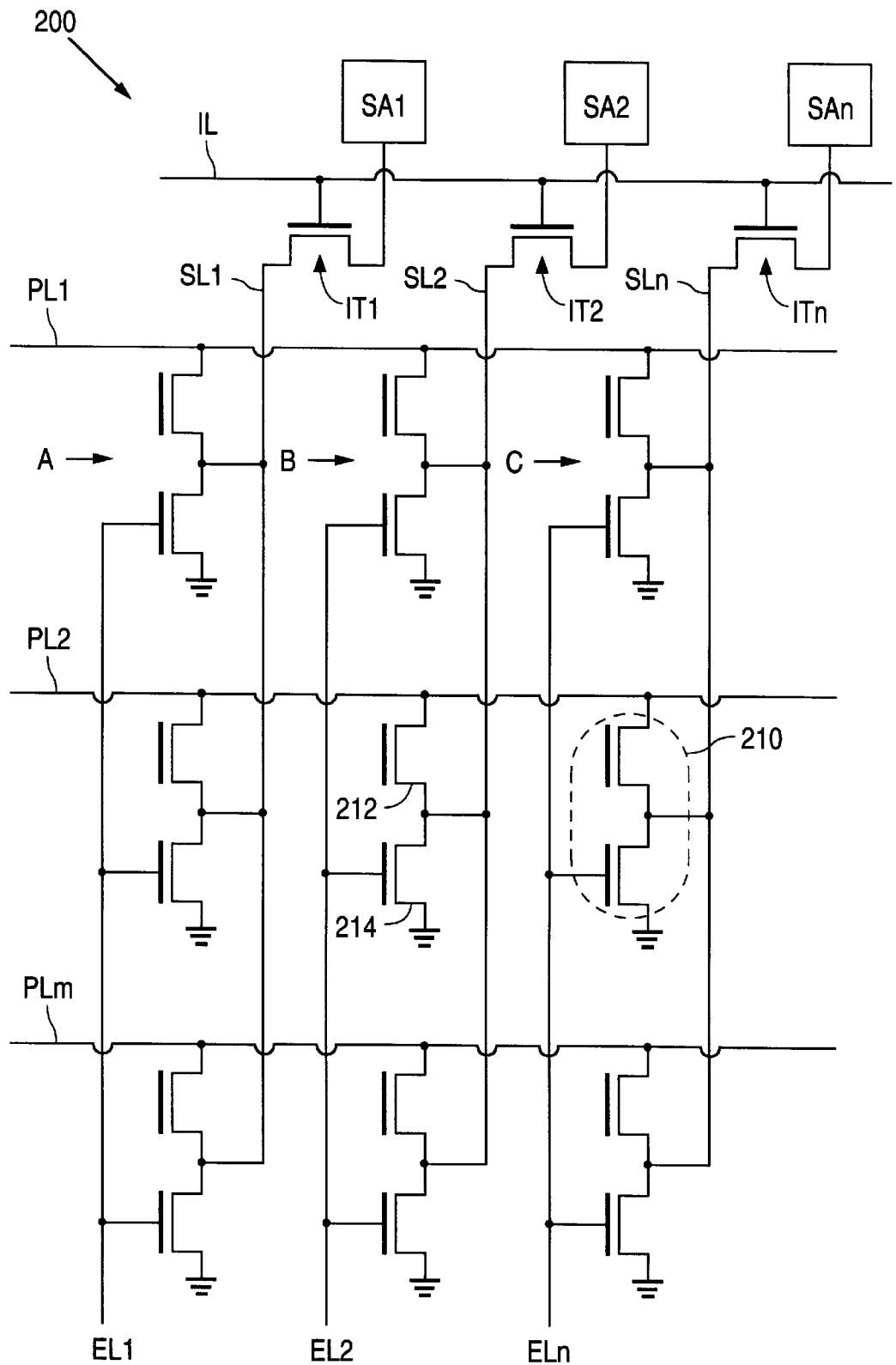
FIG. 4 is a schematic diagram illustrating a portion of a memory device 200 in accordance with the present invention.

FIG. 4 shows a schematic diagram that illustrates a portion of a memory device 200 in accordance with the present invention. As shown in FIG. 4, device 200 includes a plurality of memory cells 210 which are arranged in rows and columns.

Each memory cell 210, in turn, includes a memory transistor 212 which has a source, a drain, and a floating gate, and an access transistor 214 which has a source connected to ground, a drain connected to the drain of the memory transistor, and a gate.

Each memory transistor 212 is a p-channel Frohmann-Bentchkowsky transistor which is formed in accordance with the parent invention, i.e., formed to have a physical gate length that allows programming via hot punchthrough holes without breaking down the junction, while each access transistor 214 is an n-channel CMOS device.

As further shown in FIG. 4, device 200 also includes a plurality of page lines PL1–PLm that are formed adjacent to the rows of cells 210 so that each page line PL is connected to the source of each memory transistor 212 in a row of cells 210.

In addition, device 200 further includes a plurality of enable lines EL1–ELn, and a plurality of sense lines SL1–SLn. The enable lines EL1–ELn are formed adjacent to the columns of cells 210 so that each enable line EL is connected to the gate of each access transistor 214 in a column of cells 210.

Like the enable lines EL1–ELn, the sense lines SL1–SLn are also formed adjacent to the columns of cells 210. However, unlike the enable lines EL1–ELn, each sense line SL is connected to the drain of each memory transistor 212 in a column of cells 210.

As additionally shown in FIG. 4, device 200 also includes a plurality of isolation transistors IT1–ITn, and a plurality of sense amps SA1–SAn. The isolation transistors IT1–ITn are n-channel CMOS devices which are connected to the sense lines SL1–SLn so that each isolation transistor IT is connected to one of the sense lines SL. Further, an isolation line IL is connected to the gate of each isolation transistor IT.

The sense amps SA1–SAn, in turn, are connected to the isolation transistors IT1–ITn so that each sense amp SA is connected to one of the isolation transistors IT.

In operation, device 200 is programmed row by row (page by page) by applying ground to the isolation line IL. Grounding the isolation line IL turns off the isolation transistors IT1–ITn which, in turn, isolates the sense amps SA1–SAn from the memory cells 210.

In addition, a programming voltage, such as 3.5 volts (based on a 0.35 micron design rule), is applied to the page line PL which is connected to the row (or page) of cells 210 that contains the to-be-programmed cell(s), while ground is connected to the remainder of the page lines PL.

Further, a first enable voltage, such as 3.3 volts (based on a 0.35 micron design rule), is applied to each enable line EL1–ELn that is connected to a column of cells 210 that contains a to-be-programmed cell 210, while ground is connected to the remainder of the enable lines EL1–ELn.

For example, if only cell A in FIG. 4 is to be programmed, the programming voltage is applied to page line PL1, while ground is applied to page lines PL2–PLm. In addition, the first enable voltage is applied to enable line EL1, while ground is applied to enable lines EL2–ELn. (Isolation line IL is also grounded). When these bias conditions are applied, cell A in FIG. 4 is programmed with hot punchthrough holes as described with respect to the parent invention.

Device 200 is read row by row (page by page) by applying a second enable voltage, such as 3.3 volts (based on a 0.35 micron design rule), to the isolation line IL. Applying the second enable voltage to the isolation line IL turns on the isolation transistors IT1–ITn which, in turn, connects the sense amps SA1–SAn to the memory cells 210.

In addition, a read voltage, such as 2.0 volts (based on a 0.35 micron design rule), is applied to the page line PL which is connected to the row (or page) of cells 210 that contains the to-be-read cells, while ground is connected to the remainder of the page lines PL. Further, ground is applied to each enable line EL1–ELn.

For example, if cells A, B, and C in FIG. 4 are to be read, the read voltage is applied to page line PL1, while ground is applied to page lines PL2–PLm. In addition, ground is applied to each enable line EL1–ELn, while the second enable voltage is applied to the isolation line IL.

When these bias conditions are applied, a current flows to the sense amps SA1–SAn when the cells have been programmed, while little or no current flows when the cells have not been programmed. Each sense amp SA then detects the difference in current magnitude to determine if a logic zero or a logic one is stored in the cell.

Figure 5:
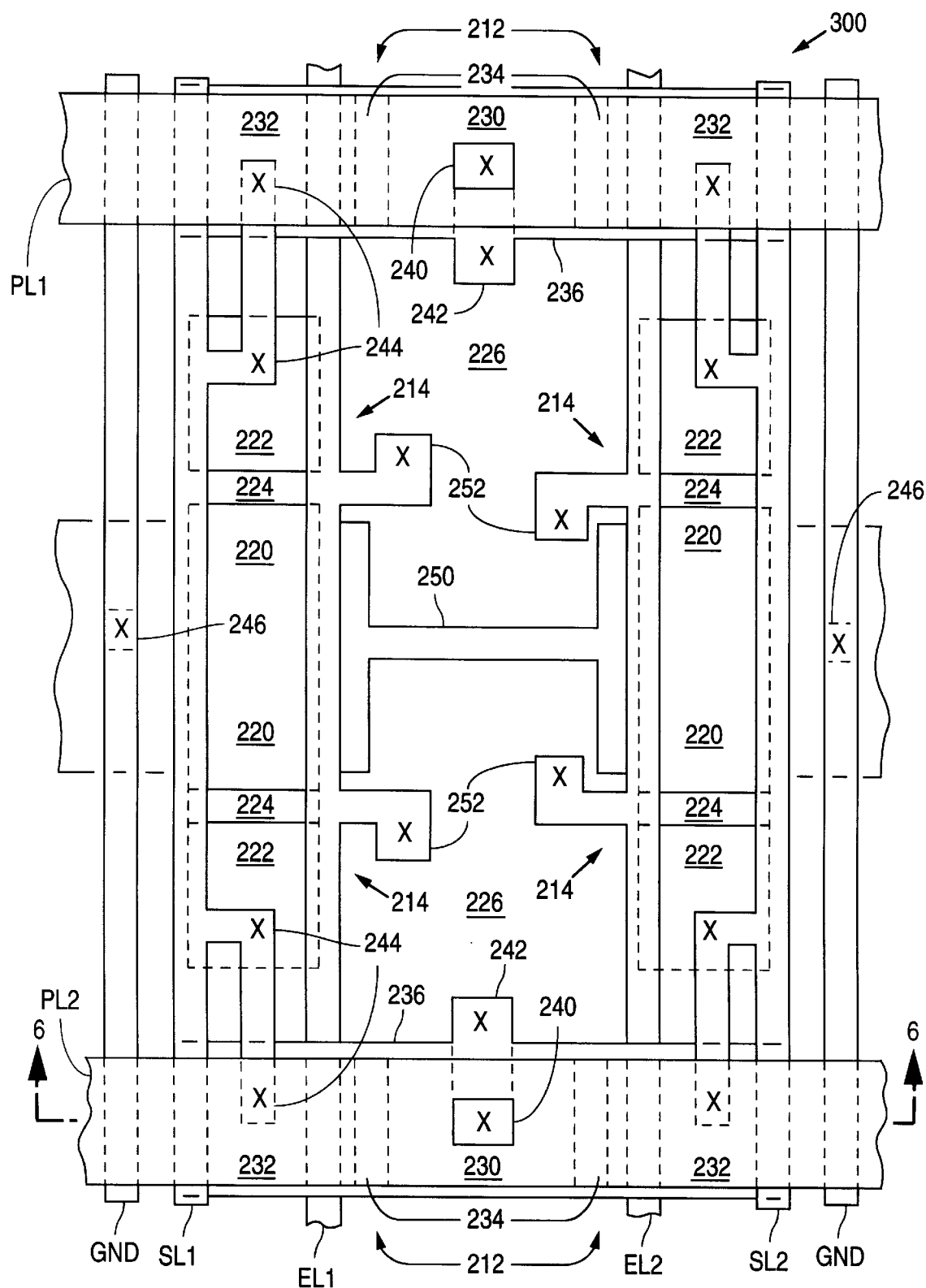
FIG. 5 is a plan view illustrating a layout 300 of a portion of device 200 in accordance with the present invention.
Figure 6:
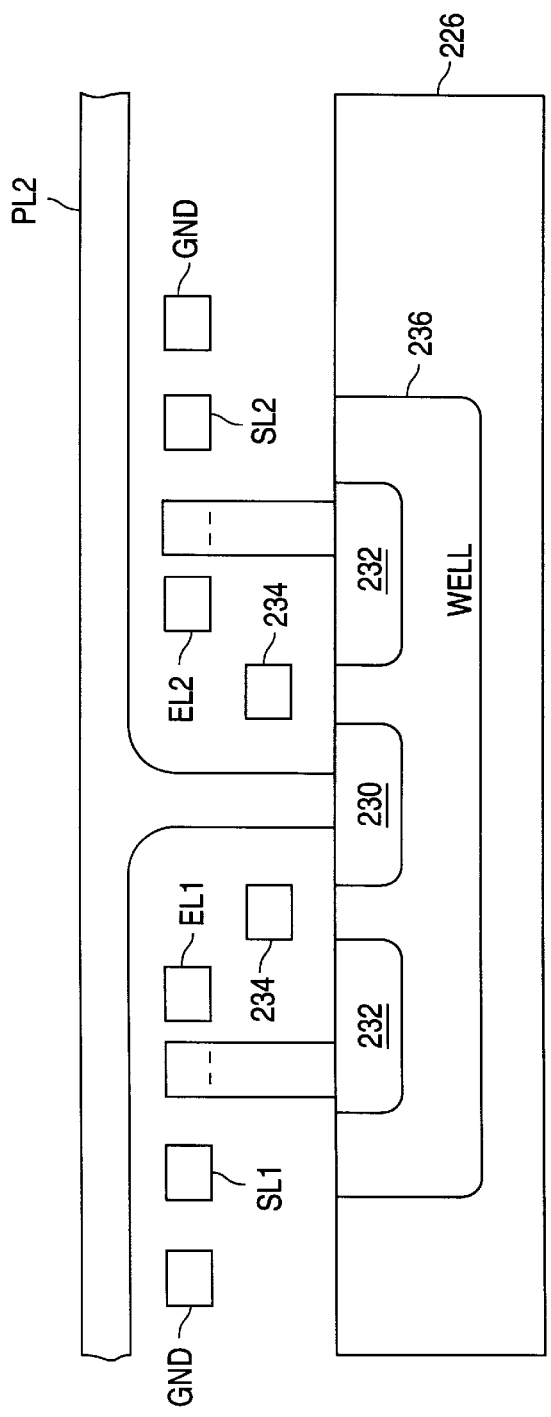
FIG. 6 is a cross-sectional view taken along line 6—6 of FIG. 5.

FIG. 5 shows a plan view that illustrates a layout 300 of a portion of device 200 in accordance with the present invention. FIG. 6 shows a cross-sectional view taken along line 6—6 of FIG. 5.

As shown in FIGS. 5 and 6, the n-channel access transistors 214, which each have a source 220, a drain 222, and a gate 224, are formed in a p-type substrate 226, while the memory transistors 212, which each have a source 230, a drain, 232, and a floating gate 234, are formed in n-wells 236 which, in turn, are formed in p-substrate 226. (The access transistors 214 may alternately be formed in a p-well).

As further shown in FIGS. 5 and 6, two memory transistors 212 are formed in each n-well 236 so that the sources 230 of each memory transistor 212 share a page line contact 240 which is connected to a page line PL. In addition, each n-well 236 has a well contact 242 that is also connected to the page line PL. (Each of the memory transistors 212 in a row may alternately be formed in a single n-well).

The drains 232 of each memory transistor 212 in a column are electrically connected together, and to the drains 222 of each access transistor 214 in the column via drain contacts 244 and a sense line SL.

In addition, the source 220 of each access transistor 214 in a column is connected to the source 220 of another access transistor 214 in the column, and is electrically connected to the sources 220 of each access transistor 214 in the column via ground contacts 246. The sources 220 of each access transistor 214 in a row are connected together via a buried source line 250. Further, the gates 224 of the access transistors 214 in a column are electrically connected together via enable contacts 252 and an enable line EL.

Figure 7:
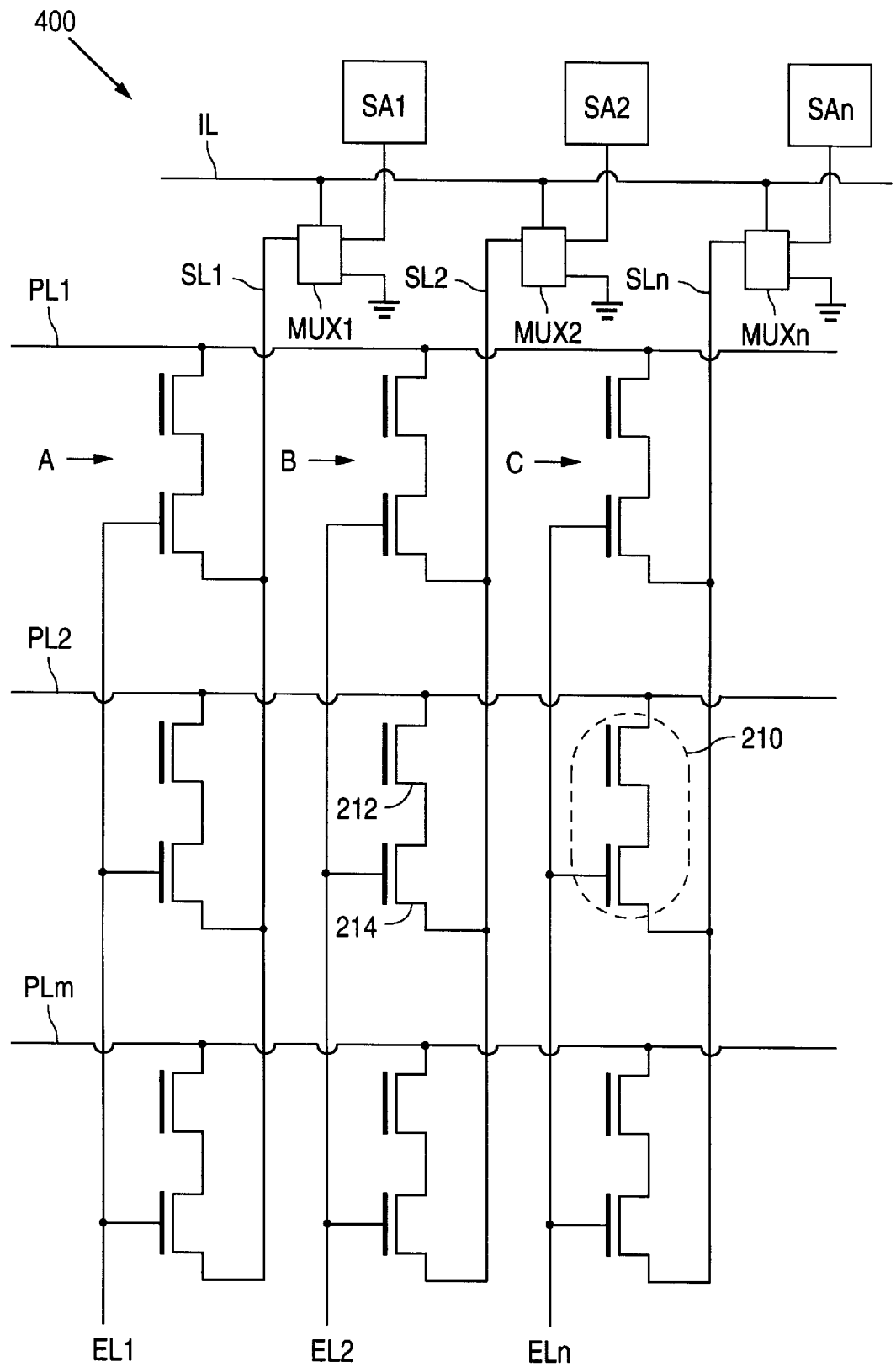
FIG. 7 is a schematic diagram illustrating a portion of a device 400 in accordance with a first alternate embodiment of the present invention.

FIG. 7 shows a schematic diagram that illustrates a portion of a device 400 in accordance with a first alternate embodiment of the present invention. As shown in FIG. 7, device 400 is similar to device 200 of FIG. 4 and, as a result, uses the same reference numerals to designate the structures which are common to both devices.

As further shown in FIG. 7, device 400 primarily differs from device 200 in that a plurality of multiplexors MUX1–MUXn are used in lieu of the isolation transistors IT1–ITn. Each multiplexor MUX, in turn, has an input connected to ground, an input connected to a sense amp SA that corresponds with a column of cells 210, and an output connected to the source of each access transistor 214 in the column of cells 210 (rather than the drain as was the case with the isolation transistors IT).

In operation, device 400 is programmed row by row (page by page) by applying ground to the isolation line IL. Grounding the isolation line IL causes the multiplexors MUX1–MUXn to connect the sense lines SL1–SLn to ground.

In addition, the programming voltage is applied to the page line PL which is connected to the row (or page) of cells 210 that contains the to-be-programmed cell(s), while ground is connected to the remainder of the page lines PL.

Further, the first enable voltage is applied to each enable line EL1–ELn that is connected to a column of cells 210 that contains a to-be-programmed cell 210, while ground is connected to the remainder of the enable lines EL1–ELn.

For example, if only cell A in FIG. 7 is to be programmed, the programming voltage is applied to page line PL1, while ground is applied to page lines PL2–PLm. In addition, the first enable voltage is applied to enable line EL1, while ground is applied to enable lines EL2–ELn. Isolation line IL is also grounded. When these bias conditions are applied, cell A in FIG. 7 is programmed with hot punchthrough holes as described with respect to the parent invention.

Device 400 is read row by row (page by page) by applying the second enable voltage to the isolation line IL. Applying the second enable voltage to the isolation line IL causes the multiplexors MUX1–MUXn to connect the sense amps SA1–SAn to the sense lines SL1–SLn.

In addition, the read voltage is applied to the page line PL which is connected to the row (or page) of to-be-read cells, while ground is connected to the remainder of the page lines PL. Further, the first enable voltage is applied to each enable line EL1–ELn.

For example, if cells A, B, and C in FIG. 7 are to be read, the read voltage is applied to page line PL1, while ground is applied to page lines PL2–PLm. In addition, the first enable voltage is also applied to each enable line EL1–ELn. The second enable voltage is also applied to the isolation line IL. When these bias conditions are applied, a current flows to the sense amps SA1–SAn when the cells have been programmed, while little or no current flows when the cells have not been programmed.

Figure 9:
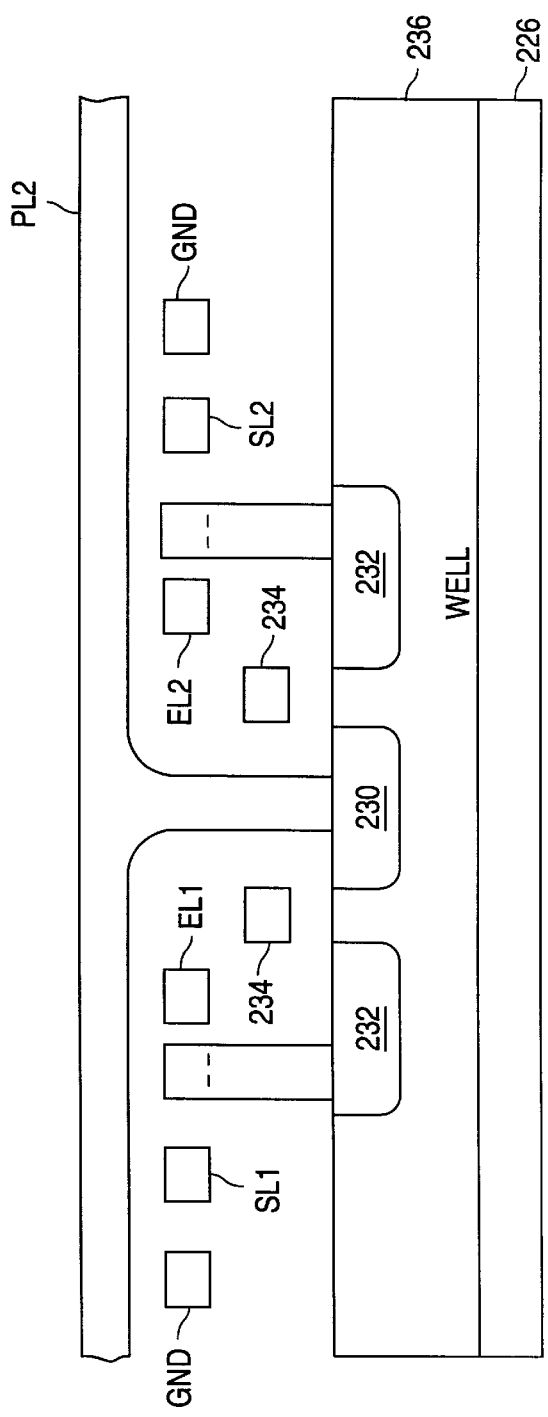
FIG. 9 is a cross-sectional view taken along line 9—9 of FIG. 8.
Figure 8:
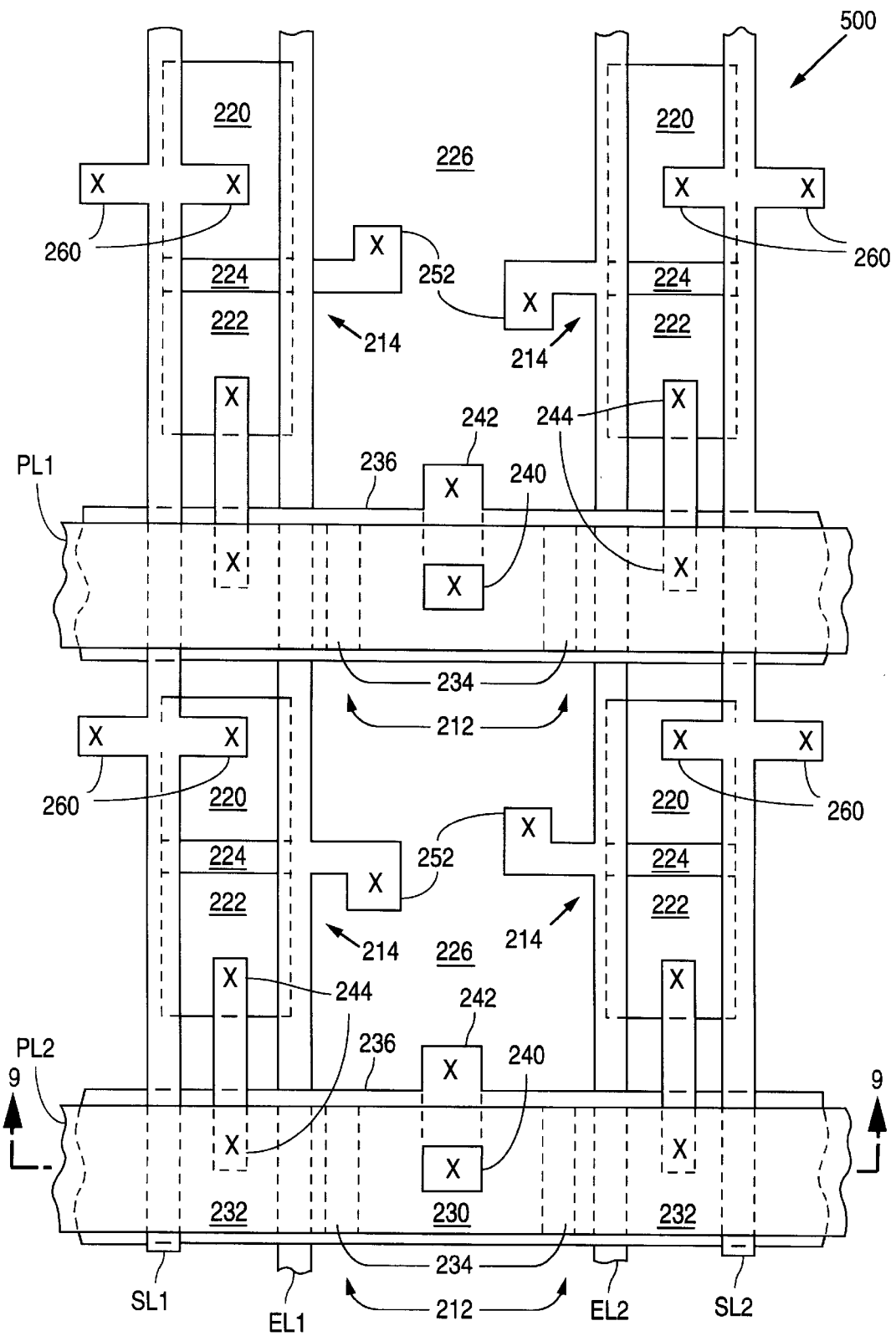
FIG. 8 is a plan view illustrating a layout 500 of a portion of device 400 in accordance with the present invention.

FIG. 8 shows a plan view that illustrates a layout 500 of a portion of device 400 in accordance with the present invention. FIG. 9 shows a cross-sectional view taken along line 9—9 of FIG. 8.

As shown in FIGS. 8 and 9, layout 500 is similar to layout 300 of FIG. 5 and, as a result, utilizes the same reference numerals to identify the structures which are common to both layouts.

Layout 500 principally differs from layout 300 in that the drain 232 of a memory transistor 212 in a column is only connected to the drain 222 of one access transistor 214 in the column, and one access transistor 214 is formed between adjacent pairs of page lines PL. Further, each of the memory transistors 212 in a row are formed in a single n-well 236. (Each pair of memory transistors 212 in a row may alternately be formed in a single n-well).

In addition, the sources 220 of each access transistor 214 in a column of cells is connected to all of the sources 220 of the access transistors 214 in the column via a source contact 260 and a sense line SL.

Figure 10:
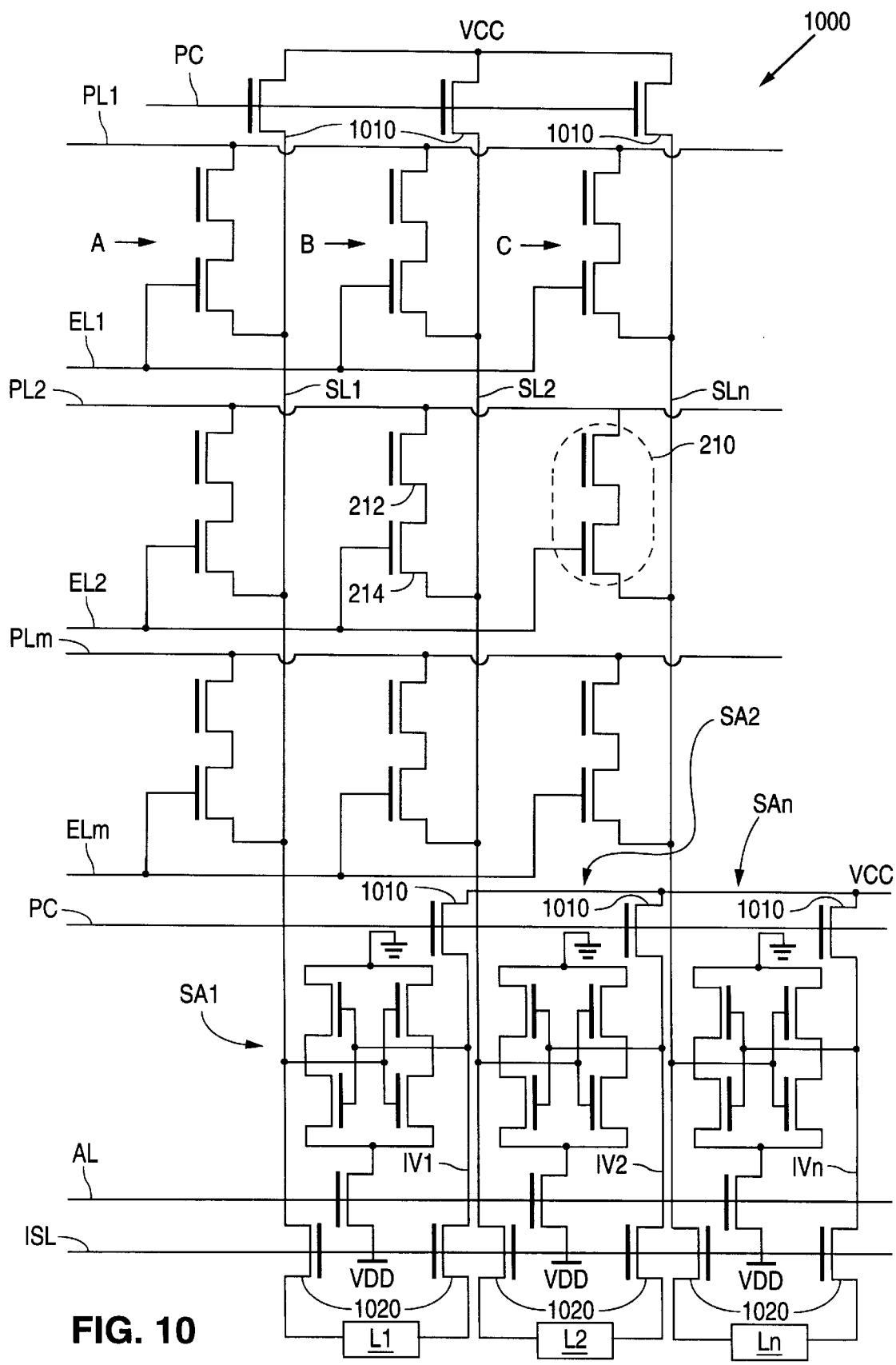
FIG. 10 is a schematic diagram illustrating a portion of a device 1000 in accordance with a second alternate embodiment of the present invention.

FIG. 10 shows a schematic diagram that illustrates a portion of a device 1000 in accordance with a second alternate embodiment of the present invention. FIGS. 11A–11E and 12A–12E are timing diagrams that illustrate the operation of device 1000. As shown in FIG. 10, device 1000 is similar to device 400 of FIG. 7 and, as a result, uses the same reference numerals to designate the structures which are common to both devices.

As further shown in FIG. 10, device 1000 differs from device 400 in that a plurality of enable lines EL1–ELm are formed adjacent to the rows of cells 210 in device 1000 rather than adjacent to the columns of cells 210 as in device 400.

In addition, sense amps SA1–SAn are connected to sense lines SL1–SLn in device 1000 rather than being isolated from sense lines SL1–SLn as in device 400. As shown, each sense amp is formed from two inverters such that the output of a first inverter is connected to a sense line SL and the input of a second inverter, while the output of the second inverter is connected to one of a plurality of inverted sense lines IV1–IVn and the input of the first inverter. Further, an amp line AL is utilized to turn on and off sense amps SA1–SAn.

Device 1000 also includes a plurality of n-channel precharge transistors 1010 which are connected to the sense lines SL1–SLn and the inverse sense lines IV1–IVn so that a precharge transistor 1010 is connected to each of the sense lines SL and each of the inverse sense lines IV. Further, a precharge line PC is connected to the gate of each precharge transistor 1010.

Device 1000 additionally includes a plurality of isolation transistors 1020, and a series of input/output latches L1–Ln. Isolation transistors 1020 are n-channel CMOS devices which are connected between the sense lines SL1–SLn and the latches L1–Ln, and between the inverse sense lines IV1–IVn and the latches L1–Ln. Further, an isolation line ISL is connected to the gate of each isolation transistor 1020.

In operation, device 1000 is programmed row by row (page by page) by first clocking a logic low onto each sense line SL that is connected to a column of cells 210 that contains a to-be-programmed cell 210, while a logic high is clocked onto each sense line SL that is connected to a column of cells 210 that contains a not-to-be-programmed cell 210.

As shown in FIGS. 11A–11E, logic lows and highs, which are output by latches L1–Ln, are clocked onto the sense lines SL1–SLn by first raising the voltages on the amp line AL and the isolation line ISL at the beginning of a write cycle. Once the lows and highs are on the sense lines SL1–SLn, the voltage on the isolation line ISL is lowered.

After the voltage on the isolation line ISL has been lowered, the programming voltage on the page line PL which is connected to the row (or page) of cells 210 that contains the to-be-programmed cell(s) is raised, while ground is connected to the remainder of the page lines PL.

Further, the first enable voltage on the enable line EL that is connected to the row of cells 210 that are to be programmed is raised after the voltage on the page line PL has been raised, while ground is connected to the remainder of the enable lines EL. In addition, precharge line PC is also grounded.

For example, if only cell A in FIG. 10 is to be programmed, once the lows and highs have been clocked onto the sense lines SL1–SLn, the programming voltage is applied to page line PL1, while ground is applied to page lines PL2–PLm. In addition, the first enable voltage is applied to enable line EL1, while ground is applied to enable lines EL2–ELn. Precharge line PC is also grounded. When these bias conditions are applied, cell A in FIG. 10 is programmed with hot punchthrough holes as described with respect to the parent invention.

As shown in FIG. 12A–12E, device 1000 is read row by row (page by page) by first raising the voltage on the precharge line PC and the amp line AL at the beginning of a read cycle. Raising the voltage on the precharge line PC turns on the precharge transistors 1010 which, in turn, places approximately VCC/2 on each sense line SL and each inverse sense line IV1–IVn.

Following this, the voltage on the precharge line PC is again lowered to turn off precharge transistors 1010. Next, the read voltage on the page line PL which is connected to the row (or page) of to-be-read cells is raised, while ground is connected to the remainder of the page lines PL.

Further, the first enable voltage on the enable line EL which is connected to the row (or page) of to-be-read cells is raised, while ground is connected to the remainder of the enable lines EL.

For example, if cells A, B, and C in FIG. 10 are to be read, the read voltage is applied to page line PL1, while ground is applied to page lines PL2–PLm. In addition, the first enable voltage is also applied to enable line EL1, while ground is applied to enable lines EL2–ELm.

When these bias conditions are applied, if cells A and C are programmed, then cells A and C will conduct a current which, in turn, raises the voltages on sense lines SL1 and SLn. The imbalance between sense line SL1 and inverse sense line IV1; and between SLn and IVn, will cause sense amps SA1 and SAn to flip.

This is similar to the approach used in DRAMs. The inverse sense lines IV1–IVn can be connected to the sense lines of a second memory block which, in turn, allows the shared use of the sense amps between the two blocks.

Figure 13:
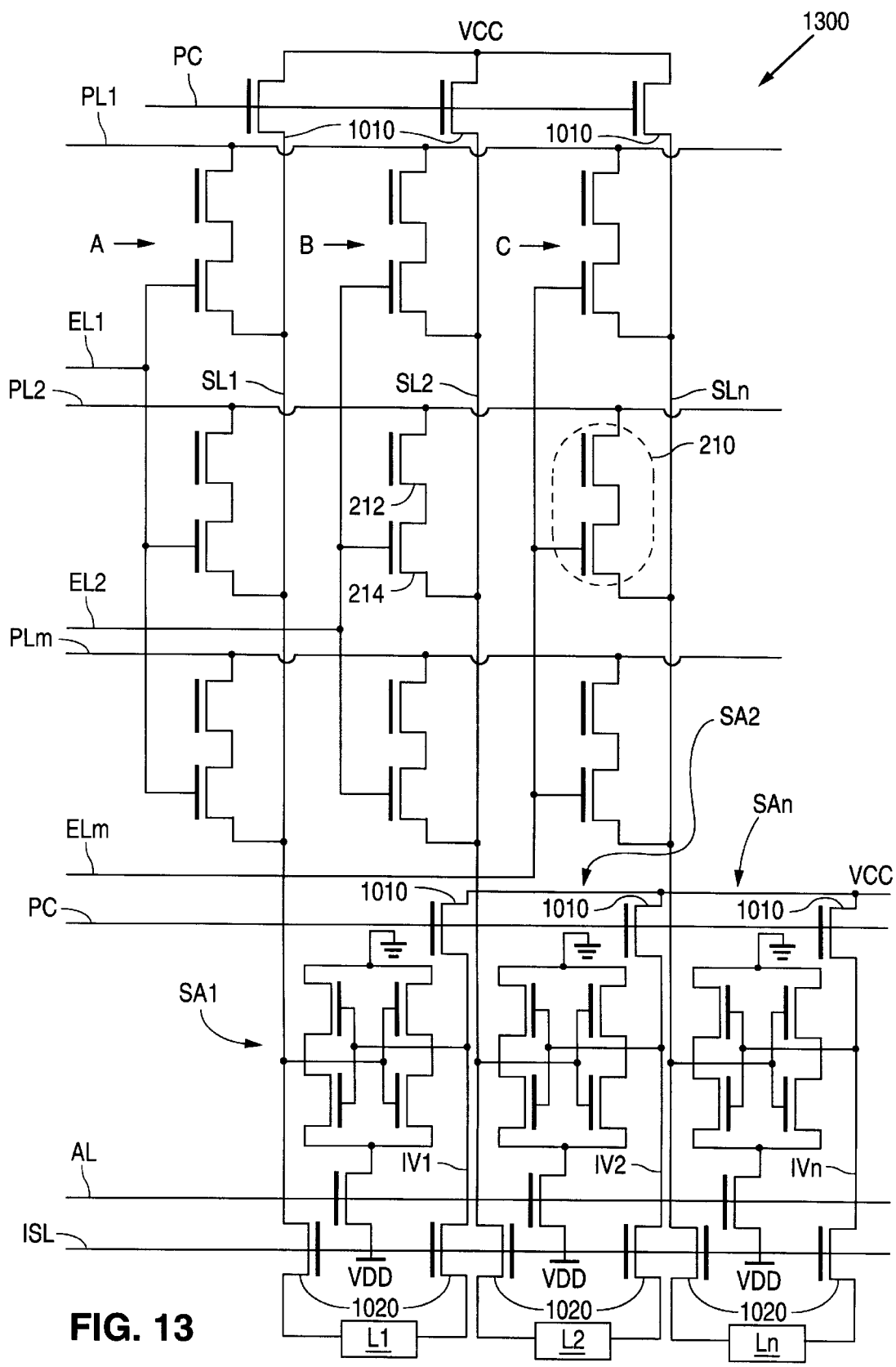
FIG. 13 is a schematic diagram illustrating a portion of a device 1300 in accordance with a third alternate embodiment of the present invention.

FIG. 13 shows a schematic diagram that illustrates a portion of a device 1300 in accordance with a third alternate embodiment of the present invention. As shown in FIG. 13, device 1300 is similar to device 400 of FIG. 7 and, as a result, uses the same reference numerals to designate the structures which are common to both devices.

As further shown in FIG. 13, device 1300 differs from device 400 in that the multiplexors MUX1–MUXn have been eliminated by using the sense amp circuitry disclosed in FIG. 10.

Device 1300 operates the same as device 400 except that device 1300 clocks logic lows onto the sense lines SL that are to be programmed rather than muxing ground onto the sense lines SL as done with device 400.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method for programming a number of memory cells in a selected row of memory cells in a memory device, the memory device having:

a plurality of memory cells arranged in rows and columns, each memory cell including:
   a memory transistor having a source and a drain of a first conductivity type formed in a substrate material of a second conductivity type, and
   an access transistor having a source and a drain of the second conductivity type formed in a substrate material of the first conductivity type, and a gate, the drain of the access transistor being connected to the drain of the memory transistor;

a plurality of page lines formed adjacent to the rows of cells so that each page line is connected to the source of each memory transistor in a row of cells;

a plurality of enable lines formed adjacent to the columns of cells so that each enable line is connected to the gate of each access transistor in a column of cells; and a plurality of sense lines formed adjacent to the columns of cells so that each sense line is connected to each cell in a column of cells;

the method comprising the steps of:

applying an enable voltage to each enable line that is connected to a to-be-programmed memory cell in the selected row; and applying a programming voltage to the page line that is connected to the selected row of memory cells, the programming voltage being sufficient to induce hot punchthrough holes to flow from the source region to the drain region, and insufficient to induce avalanche breakdown at the drain-to-substrate material of the second conductivity type junction.

2. The method of claim 1 and further comprising the steps of:

applying ground to each enable line that is connected to a not-to-be-programmed memory cell in the selected row; and applying ground to each page line that is connected to a row of cells which is not to be programmed.

3. The method of claim 1 wherein the substrate material of the second conductivity type is electrically connected to the source of the memory transistor.

4. The method of claim 1 wherein the substrate material of the second conductivity type is a well.

5. The method of claim 4 wherein a pair of memory transistors are formed in the well.

6. The method of claim 4 wherein a row of memory transistors are formed in the well.

7. The method of claim 1 wherein each access transistor is connected to a sense line and only one memory transistor.

8. The method of claim 1 wherein each access transistor is connected to a ground node.

9. The method of claim 1 and further comprising the step of isolating the sense lines.

10. The method of claim 9 and further comprising the steps of:

applying ground to each enable line that is connected to a not-to-be-programmed memory cell in the selected row; and applying ground to each row of page lines connected to rows of cells which are not to be programmed.

11. The method of claim 1 and further comprising the step of grounding the sense lines.

12. The method of claim 11 and further comprising the steps of:

applying ground to each enable line that is connected to a not-to-be-programmed memory cell in the selected row; and applying ground to each row of page lines connected to rows of cells which are not to be programmed.

13. A method for programming a number of memory cells in a selected row of memory cells in a memory device, the memory device having:

a plurality of memory cells arranged in rows and columns, each memory cell including:

a memory transistor having a source and a drain of a first conductivity type formed in a substrate material of a second conductivity type, and an access transistor having a source and a drain of the second conductivity type formed in a substrate material of the first conductivity type, and a gate, the drain of the access transistor being connected to the drain of the memory transistor;

a plurality of page lines formed adjacent to the rows of cells so that each page line is connected to the source of each memory transistor in a row of cells;

a plurality of enable lines formed adjacent to the rows of cells so that each enable line is connected to the gate of each access transistor in a row of cells; and a plurality of sense lines formed adjacent to the columns of cells so that each sense line is connected to each cell in a column of cells;

the method comprising the steps of:

placing a logic low on each sense line that is connected to a to-be-programmed memory cell in the selected row;

applying an enable voltage to the enable line that is connected to the selected row of memory cells, the enable voltage being sufficient to turn on the access transistors in the selected row;

applying a programming voltage to the page line that is connected to the selected row of memory cells, the programming voltage being sufficient to induce hot punchthrough holes to flow from the source region to the drain region, and insufficient to induce avalanche breakdown at the drain-to-substrate material of the second conductivity type junction.

14. The method of claim 13 and further comprising the steps of:

applying ground to each enable line that is connected to a row of cell which is not to be programmed; and applying ground to each page line that is connected to a row of cells which is not to be programmed.

15. The method of claim 13 wherein the substrate material of the second conductivity type is electrically connected to the source of the memory transistor.

16. The method of claim 13 wherein the substrate material of the second conductivity type is a well.

17. The method of claim 16 wherein a pair of memory transistors are formed in the well.

18. The method of claim 16 wherein a row of memory transistors are formed in the well.

19. The method of claim 13 wherein each access transistor is connected to a sense line and only one memory transistor.

20. The method of claim 13 and further comprising the step of placing a logic high on each sense line that is connected to a not-to-be-programmed memory cell in the selected row.

* * * * *